(12) United States Patent
Peterson et al.

(10) Patent No.: US 8,174,255 B2
(45) Date of Patent: May 8, 2012

(54) HALL EFFECT SYSTEM

(75) Inventors: Terry Peterson, Eagle Rock, CA (US);
Kevin Allen, Canyon Country, CA (US);
Joe C. Fielding, Moorpark, CA (US);
Raymond Francisco, Tujunga, CA (US); Charlotte A. Marelius, Granada Hills, CA (US); David D. Drobnis, Mar Vista, CA (US); John Ronquillo, Los Angeles, CA (US)

(73) Assignee: Mason Electric Co., Sylmar, CA (US)

( * ) Notice: Subject to any disclaimer, the term of this patent is extended or adjusted under 35 U.S.C. 154(b) by 945 days.

(21) Appl. No.: 12/144,602

(22) Filed: Jun. 23, 2008

(65) Prior Publication Data

US 2009/0115404 A1    May 7, 2009

Related U.S. Application Data

(60) Provisional application No. 60/945,549, filed on Jun. 21, 2007, provisional application No. 60/975,756, filed on Sep. 27, 2007, provisional application No. 61/027,404, filed on Feb. 8, 2008.

(51) Int. Cl.
*G01B 7/14* (2006.01)
(52) U.S. Cl. .................. 324/207.2; 324/207.24; 702/153
(58) Field of Classification Search .. 324/207.2–207.26; 702/153
See application file for complete search history.

(56) References Cited

U.S. PATENT DOCUMENTS

| | | | |
|---|---|---|---|
| 4,489,303 A | 12/1984 | Martin | |
| 4,520,242 A | 5/1985 | Kopsho, Jr. | |
| 4,661,773 A | 4/1987 | Kawakita et al. | |
| 4,825,157 A | 4/1989 | Mikan | |
| 4,853,630 A | 8/1989 | Houston | |
| 5,160,918 A | 11/1992 | Saposnik et al. | |
| 5,266,917 A | 11/1993 | Bleeke et al. | |
| 5,399,967 A | 3/1995 | Carscadden et al. | |
| 5,421,694 A | 6/1995 | Baker et al. | |
| 5,850,142 A | 12/1998 | Rountos et al. | |
| 5,969,520 A * | 10/1999 | Schottler | 324/207.2 |
| 6,738,043 B2 * | 5/2004 | Endo | 345/158 |
| 2004/0104080 A1 | 6/2004 | Sweet et al. | |
| 2005/0236264 A1 | 10/2005 | Asada | |

OTHER PUBLICATIONS

International Search Report under International Application No. PCT/US2008/067945, mail date of Oct. 7, 2008, 3 pages.

* cited by examiner

*Primary Examiner* — Jay Patidar
(74) *Attorney, Agent, or Firm* — Perkins Coie LLP

(57) ABSTRACT

A hall effect system having a housing, an input element coupled to the housing, and a magnetic element coupled to the input element and configured to have a detectable magnetic flux. A sensing element is adjacent to the magnetic element. The sensing element is configured to sense the magnetic flux. A processing element is coupled to the sensing element and is configured to determine a position of the magnetic element relative to the sensing element by determining changes in and/or the orientation of the magnetic flux upon movement of the interface element by a user.

19 Claims, 6 Drawing Sheets

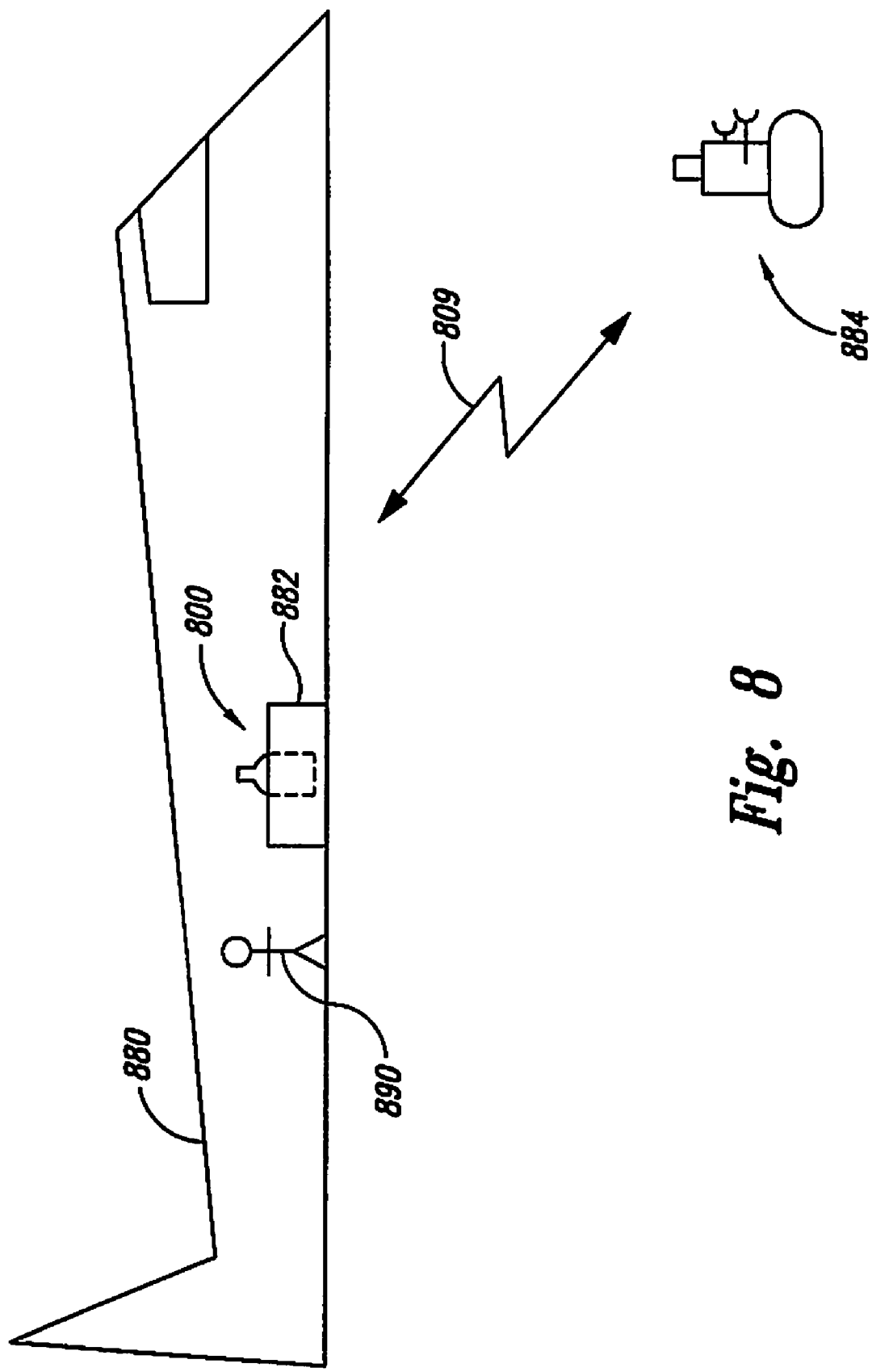

HALL EFFECT SYSTEM

CROSS REFERENCE TO RELATED APPLICATIONS

The present application claims the benefit of U.S. Provisional Patent Application No. 60/945,549, entitled HALL EFFECT SYSTEMS AND METHODS, filed Jun. 21, 2007, U.S. Provisional Patent Application No. 60/975,756 entitled HALL EFFECT METHODS AND SYSTEMS, filed Sep. 27, 2007, and U.S. Provisional Patent Application No. 61/027,404, entitled HALL EFFECT METHODS AND SYSTEMS, filed Feb. 8, 2008, all of which are fully incorporated herein by reference.

SUMMARY

The present invention provides hall effect systems and methods that overcome drawbacks experienced in the prior art and provide additional benefits. In accordance with one embodiment, a hall effect system comprises a housing, an input element coupled to the housing, a magnetic element coupled to the input element and configured to have a detectable magnetic flux, a sensing element adjacent to the magnetic element, the sensing element being configured to sense the magnetic flux, and a processing element coupled to the sensing element and configured to determine a position of the magnetic element relative to the sensing element be determining changes in and/or the orientation of the magnetic flux upon movement of the interface element by a user.

In another embodiment, a hall effect system comprises a housing with a first contact surface portion; an input element coupled to the housing and having a second contact surface portion immediately adjacent to the first contact surface portion, the input element being moveable relative to the housing whereby the second contact surface is moveable relative to the first contact surface to define a range of motion of the input element relative to the housing; a magnetic element coupled to the input element and being moveable with the input element relative to the housing, the magnetic element being configured to provide a detectable magnetic flux; a sensing element adjacent to the magnetic element, the sensing element being configured to sense the magnetic flux; and a processing element coupled to the sensing element and configured to determine a position of the magnetic element relative to the sensing element be determining changes in and/or the orientation of the magnetic flux upon movement of the interface element by a user.

BRIEF DESCRIPTION OF THE DRAWINGS

FIG. 8 is a partially schematic illustration of a hall effect system carried by a control device in accordance with selected embodiments of the invention.

DETAILED DESCRIPTION

In the following description, numerous specific details are provided in order to give a thorough understanding of embodiments of the invention. One skilled in the relevant art will recognize, however, that the invention may be practiced without one or more of the specific details, or with other methods, components, materials, etc. In other instances, well known structures, materials, or operations are not shown or described in order to avoid obscuring aspects of the invention.

The terminology used in the description presented below is intended to be interpreted in its broadest reasonable manner, even though it is being used in conjunction with a detailed description of certain specific embodiments of the invention. Certain terms may even be emphasized below; however, any terminology intended to be interpreted in any restricted manner will be overtly and specifically defined as such in this Detailed Description section.

References throughout the specification to "one embodiment" or "an embodiment" means that a particular feature, structure, or characteristic described in connection with the embodiment and included in at least one embodiment of the present invention. Thus, the appearances of the phrase "in one embodiment" or "in an embodiment" in various places throughout the specification are not necessarily all referring to the same embodiment. Furthermore, the particular features, structures, or characteristics may be combined in any suitable manner in one or more embodiments.

Selected aspects of the invention include hall effect system for converting mechanical motions into a usable output. For example, in selected embodiments motion in one or more directions (e.g., motions in an XY plane) can be converted into a proportional output. In selected embodiments, the output can include an electrical output, such as a voltage output. In other embodiments, the output can include another type of output signal, including various types of electromagnetic signals such as those suitable to be carried in a fiber optic pathway and/or wireless type transmissions.

Figure 1:
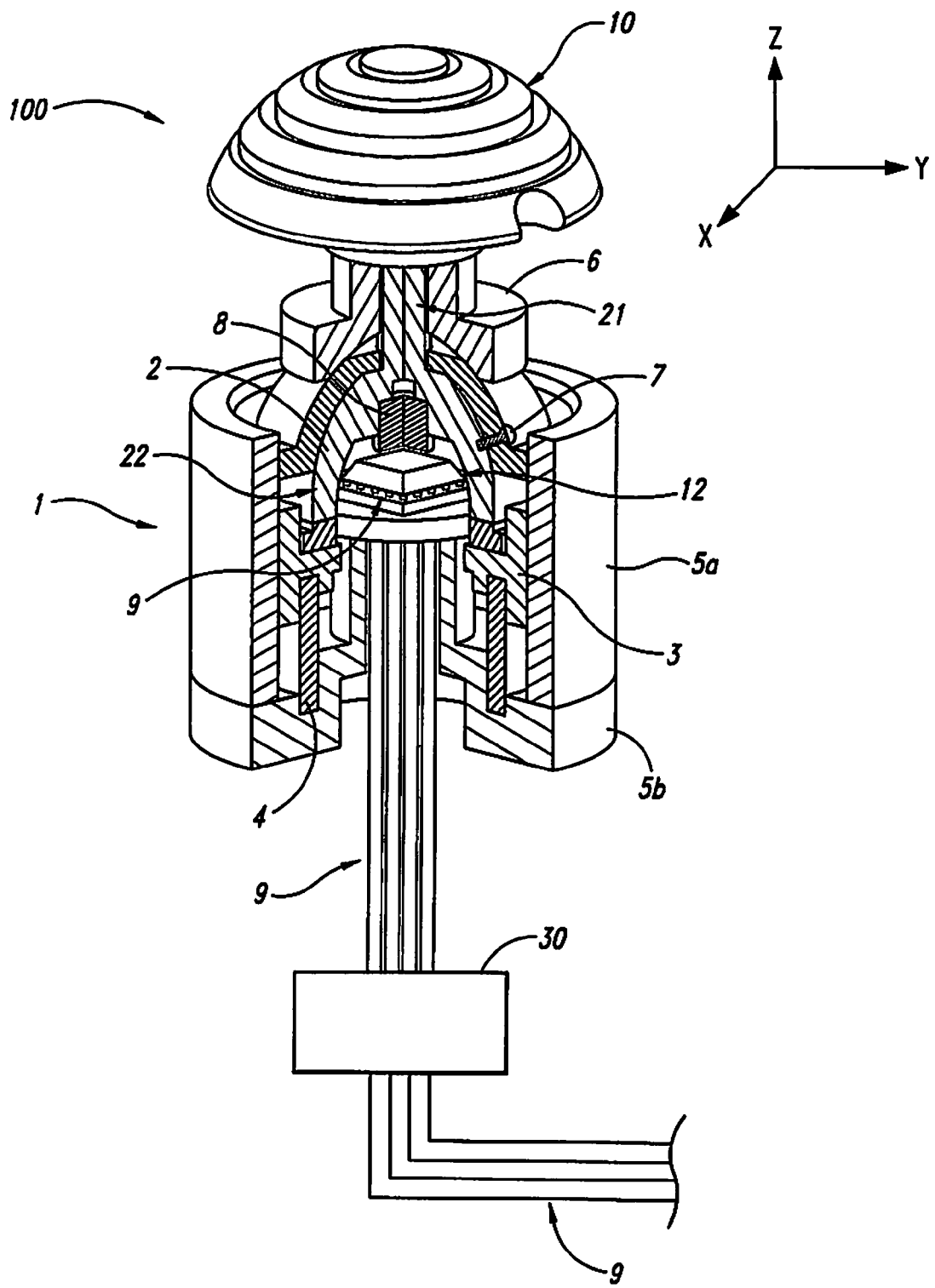
FIG. 1 is an isometric cut away illustration of a hall effect system in accordance with embodiments of the invention.

A hall effect system 100 in accordance with selected embodiments of the invention is shown in FIG. 1. In FIG. 1, the system includes a housing 1, an input element 2, an interface element 10 coupled to the input element 2, a magnetic element 8 coupled to the input element 2, a sensing element 12, and a processing element 30. In the illustrated embodiment, the sensor 12 includes a sensor configured to sense magnetic flux generated by the magnetic element 8. In FIG. 1, the system 100 is configured to determine a position of the magnetic element 8 by sensing changes in the magnetic flux and/or the orientation of the magnetic flux relative to the sensor 12. Accordingly, because in the illustrated embodiment the magnetic element 8 is coupled to the input element 2, a position of the input element 2 can be determined as the input element is moved by an operator.

In FIG. 1, the input element 2 includes an extension portion 21 and a flared portion 22. The flared portion 22 of the input element 2 is positioned at least partly within the interior of the housing (e.g., at least partly surrounded by the housing) and carries the magnetic element 8 so that the magnetic element is proximate to the sensing element 12. In the illustrated embodiment, the extension portion 21 of the input element 2 extends away from the flared portion 22 through an aperture in the housing. The extension portion 21 is coupled to the interface element 10 so that when the operator applies a force to the interface element 10 at least approximately in the XY plane, the flared portion 22 of the input element 2 moves (e.g., rotates in the housing). As the flared portion 22 of the input element 2 moves, the magnetic element 8 moves relative to the sensor 12.

Figure 2:
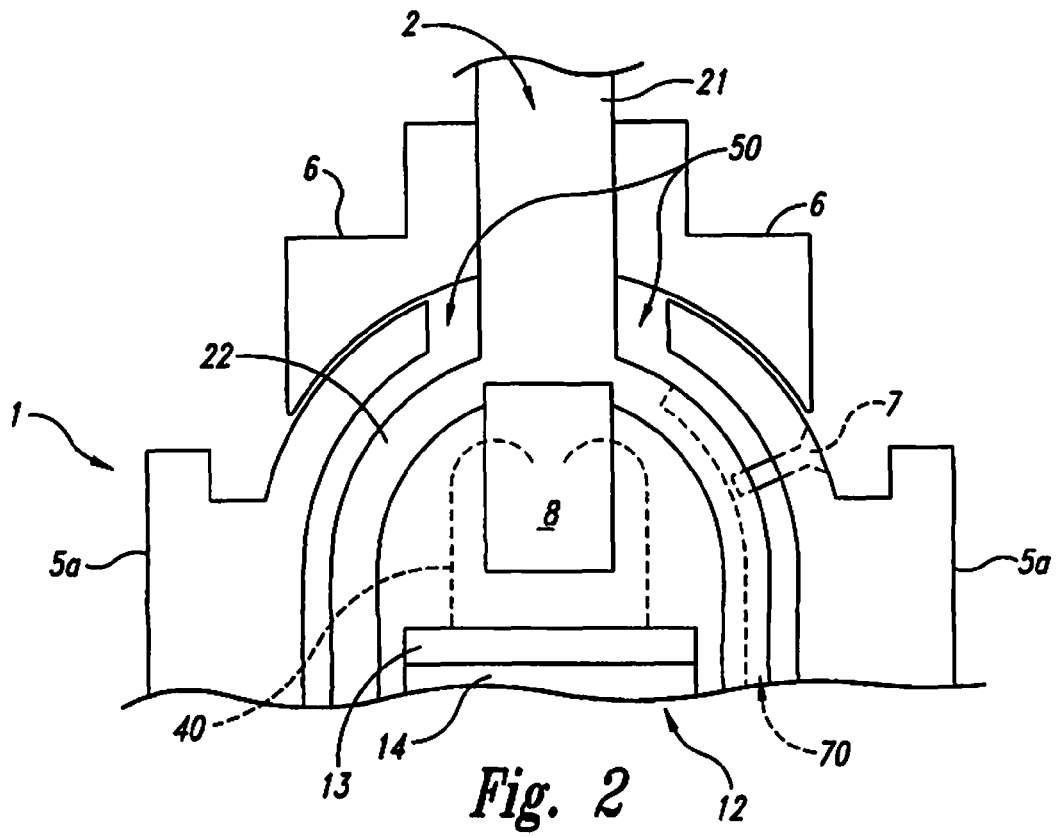
FIG. 2 is a partially schematic cross-sectional elevation view of a portion of the hall effect system shown in FIG. 1 with an input element in a first position in accordance with selected embodiments of the invention.
Figure 3:
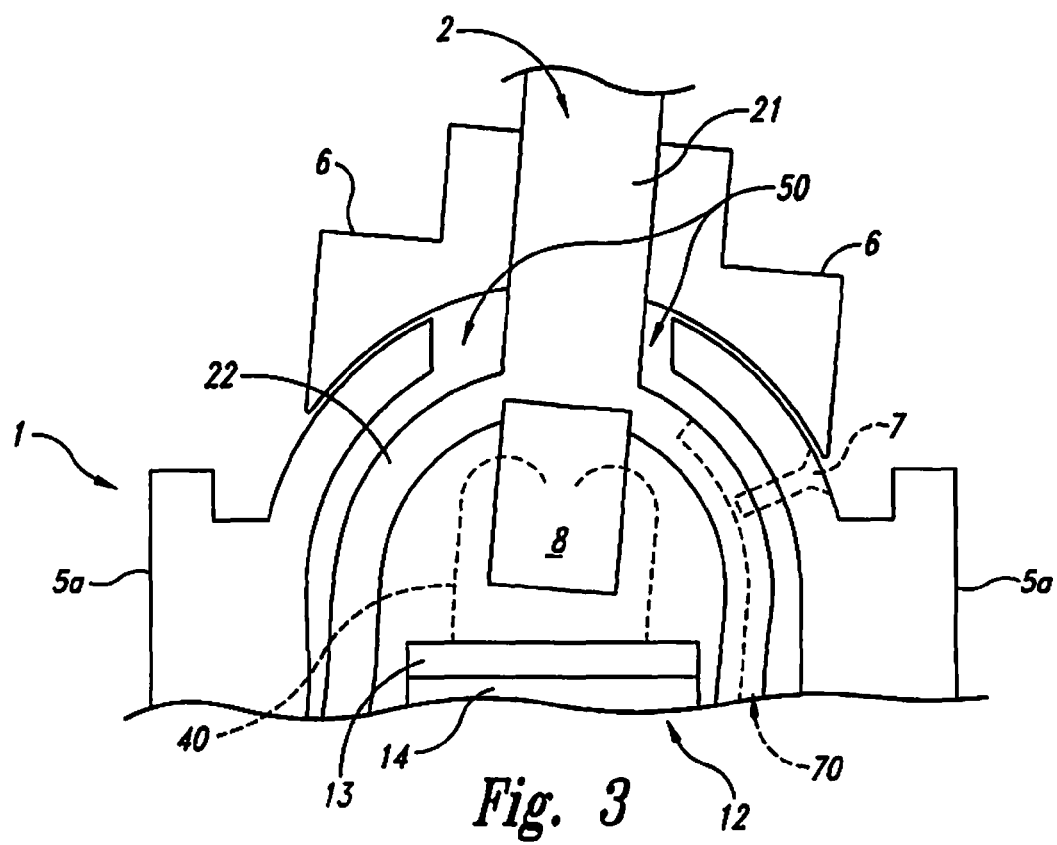
FIG. 3 is a partially schematic cross-sectional elevation view of the portion of the hall effect system shown in FIG. 2 with the input element in a second position in accordance with certain embodiments of the invention.

FIG. 2 shows a portion of the hall effect system 100 with the input element 2 in a first or neutral position and FIG. 3 shows the portion of the hall effect system 100 with the input element 2 in a second or displaced position. As shown in FIGS. 2 and 3, as the input element 2 moves the magnetic element 8, the magnetic flux 40 of the magnetic field produced by the magnetic element 8 moves relative to the sensor 12. In selected embodiments, the sensor 12 can sense the orientation of the magnetic flux 40 relative to the sensor 12 and/or changes in the magnetic flux 40 relative to the sensor 12 (e.g., including movement of the magnetic flux 40 relative to the sensor 12). This sensed information can be used to determine the position of the magnetic element 8, and thereby the position of the input element 2. For example, the relationship between the orientation of the magnetic flux 40, the magnetic element 8, the input element 2, the interface element 10, and/or the sensor 12 can be determined through experimentation and/or calculation. This relationship can then be used to determine the position of the input element 2 based on the sensed orientation of the magnetic flux 40 relative to the sensor during use or operation of the hall effect system.

In the illustrated embodiment, the sensor 12 includes a computer chip 13 on a circuit board 14. The sensor can send a signal corresponding to the sensed information to a processing element 30 (shown in FIG. 1) via signal pathways 9. The processing element 30 can then provide an output signal (e.g., via additional signal pathways 9) corresponding to the orientation of the magnetic flux 40, which in turn can correspond to the orientation of the magnetic element 8 and the input element 2.

In other embodiments, the system 100 can have other arrangements. For example, in other embodiments the sensor 12 can include other types of magnetic flux sensors. Although in FIGS. 1-3 the pathways 9 are shown as ribbon cables, in other embodiments the pathways 9 can include other types of pathways including fiber optic cables and wireless connections. Furthermore, in selected embodiments the pathways 9 can carry signals and/or power (e.g., electrical power) between various hall effect system components and/or between the hall effect system and other systems/devices. Additionally, although in the illustrated embodiment the magnetic element 8 includes a fixed magnet, in other embodiments the magnetic element 8 can include other types of magnetic devices including an electromagnet.

Furthermore, in other embodiments the processing element 30 can be carried in other locations and/or have other arrangements. For example, in selected embodiments the processing element 30 can include a microprocessor and/or a portion of another computing device or system. Additionally, the processing element 30 can be distributed among multiple components (e.g., the processing element 30 can include a distributed computing system). Although in the illustrated embodiment, the processing element 30 is shown exterior to the housing, in other embodiments at least a portion of the processing element 30 can be carried internal to the housing.

For example, in selected embodiments at least a portion of the processing element 30 can be carried on, or integral to, the circuit board 14.

In FIGS. 1-3, the housing 1 includes a first portion 5a and a second portion 5b. The first portion 5a is positioned to surround at least a portion of the flared portion 22 of the input element 2. The second portion 5b is coupled to the first portion and positioned to carry the sensor 12. In selected embodiments, the housing 1 and/or other hall effect system components can be configured to provide electromagnetic interference (EMI) protection so that the system 100 can be compatible for operation with other electronic devices. For example, in certain embodiments at least part of the housing 1 can include an aluminum material and the input element 2 can include a stainless steel material. Accordingly, the housing 1 and input element 2 can work to reduce the amount of electromagnetic energy transmitted between the interior and exterior of the housing 1. For example, in selected embodiments various techniques can be used to ground parts of the housing 1 and/or input element 2 using wire bonds, conductive coatings, and/or the like.

In FIGS. 1-3, the outer surface of the flared portion 22 of the input element 2 is positioned proximate to the inner surface of the housing 1. As discussed above, at least a part of the extension portion 21 extends through the aperture 50 in of the housing 1. In the illustrated embodiment, a cover element 6 is coupled to the extension portion 21 proximate to an exterior part of the housing 1 and covering at least a portion of the aperture 50. As the input element 2 moves, part of the extension portion 21 moves within the aperture as shown in FIGS. 2 and 3. In FIGS. 1-3, the cover element 6 is configured so that as the cover element 6 moves with the extension portion 21, the cover element continues to cover at least a portion of the aperture 50. In selected embodiments, the cover portion can serve to prevent the entire input element 2 from moving in the Z direction. For example, although the flared portion 22 of the input element 2 can rotate as the extension portion 21 of the input element is moved at least approximately in the XY plane, the entire input element 2 is prevented from moving as a unit in the Z direction by the housing 1 and the cover element 6.

Additionally, in certain embodiments the cover element 6 can serve as a wiper and/or seal to prevent foreign matter/objects from entering the interior of the housing. In still other embodiments, the cover element 6 can serve as a hard stop. For example, in certain embodiments the cover element 6 can be configured to impact a part of the housing 1 when the input element 2 has been deflected a selected amount. In other embodiments, the input element 2 can act as a hard stop by impacting various hall effect system components when it has been deflected a selected amount, for example, by impacting a portion of the housing 1. The cover element 6 can be made from various materials including rubber, nylon, plastic, wood, and/or metal. In some embodiments, the cover element 6 can be made from a lubricous material (e.g., Teflon®) to facilitate the cover element 6 in gliding or sliding over the exterior of the housing 1. In certain embodiments, this feature can allow a high downward force to be applied to the input element via the interface element 10 while retaining a smooth glide feel and preventing the input element 2 from moving as a unit in the Z direction. In selected embodiments, the cover element 6 can include a coating such as a lubricous, and insulative, and/or conductive coating (e.g., to aid in reducing EMI).

In the illustrated embodiment, the hall effect system 100 includes one or more guide devices 7 that guides movements and/or prevent movements in selected directions. For example, in FIGS. 1-3 the guide device 7 acts as an anti-rotation device and extends into or through a guide interface 70 (e.g., a groove or slot in the flared portion 22 of the input element 2) to prevent the input element 2 from substantially rotating about the Z axis. In other embodiments, the guide device(s) 7 can include other arrangements and/or have other locations. For example, in other embodiments the interface element 10 can be rotatably coupled to the input element 2 and a guide device can be used to prevent the interface element 10 from rotating in a selected direction relative to the input element 2, while allowing the interface element 10 to rotate in another direction relative to the input element 2. In still other embodiments, the hall effect system 100 does not include any guide device(s) 7.

In FIGS. 1-3, the hall effect system 100 also includes force assembly 4. In the illustrated embodiment, the force assembly 4 includes a resilient material that has a rest position to which it tends to return when displaced. For example, in selected embodiments the force assembly 4 can provide a centering force to urge the input element 2 to return to the first or neutral position shown in FIGS. 1 and 2 when an operator removes any force from the interface device 10/input element 2. Additionally, in selected embodiments the force assembly 4 can provide a force resisting movement of the input device 2 in selected directions. For example, in selected embodiments the force assembly 4 can be configured to resist movement of the input element 2 away from the neutral position or any movement of the input element 2 in any direction.

In certain embodiments, the force assembly 4 can provide a force gradient so that an operator is provided tactile feedback (e.g., a selected force and/or feel for selected displacements and/or rates of movement of the input element 2). For example, in certain embodiments the force assembly 4 can provide an exponential increase in the force required to move the input element 2 away from the neutral position as the input element 2 is moved further away from the neutral position. In selected embodiments, the force gradient can be changed by changing a portion of the force assembly 4.

In the illustrated embodiment, the force assembly 4 includes a "donut" of resilient material (e.g., a rubber donut). A transmission or support element 3 is positioned between the force assembly 4 and the flared portion 22 of the input element 2. As the extension portion 21 of the input element 2 is moved by an operator, the flared portion 22 rotates within the housing 1 and compresses a portion of the force assembly 4. The force assembly urges the input element 2 to return to the neutral position, providing tactile feedback to the operator. In FIGS. 1-3, once force is removed from the input element 2, the urging force supplied by the force assembly 4 can cause the input element 2 to return to the neutral position.

Figure 5:
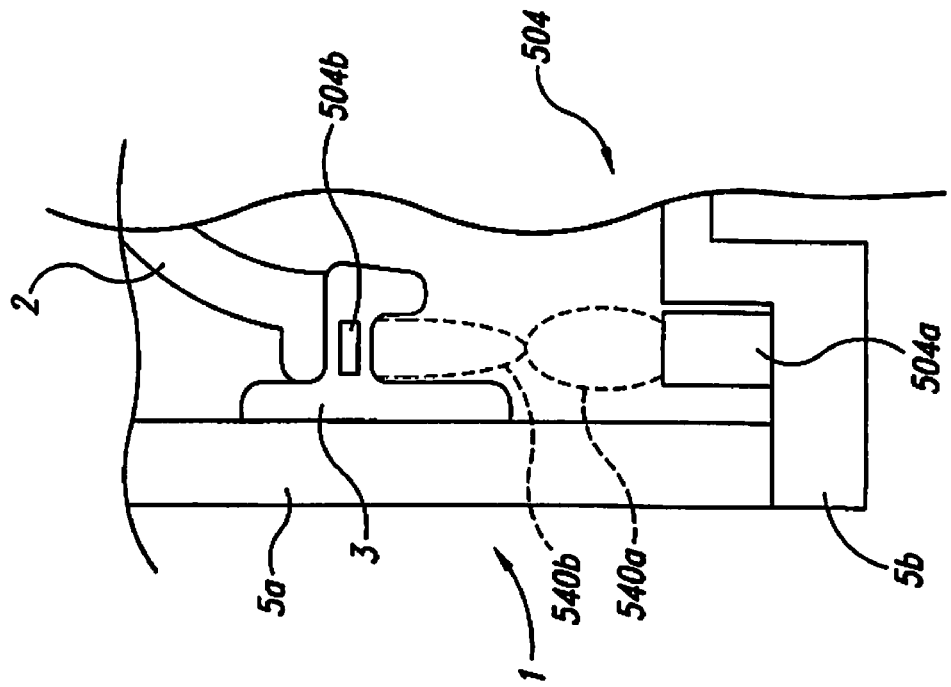
FIG. 5 is a partially schematic cross-sectional elevation view of another type of force assembly in accordance with other embodiments of the invention.
Figure 4:
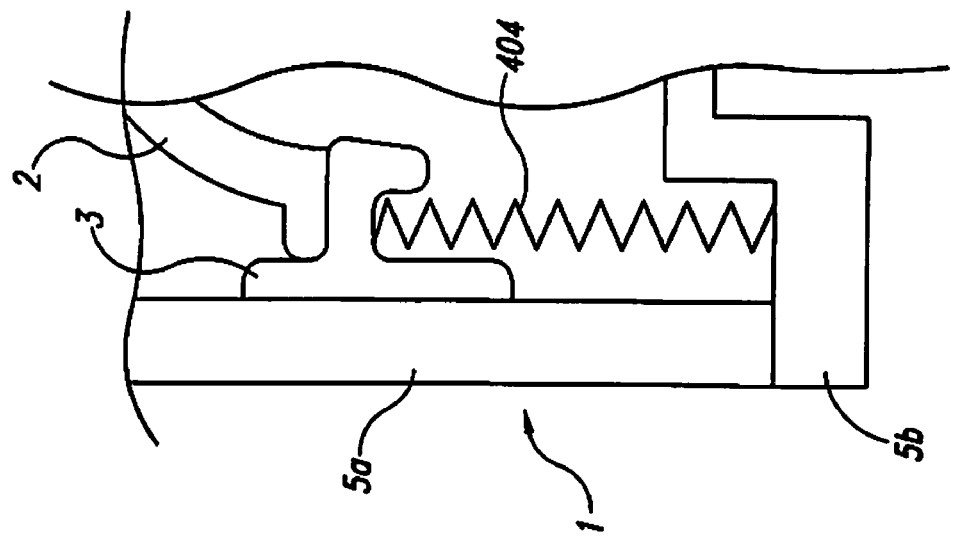
FIG. 4 is a partially schematic cross-sectional elevation view of a force assembly in accordance with selected embodiments of the invention.

In other embodiments, the force assembly 4 can have other arrangements. For example, as shown in FIG. 4, in selected embodiments a force assembly 404 can include one or more spring devices (e.g., coiled springs). In still other embodiments, as shown in FIG. 5, a force assembly 504 can use one or more magnetic fields 540 to provide a desired force (shown in FIG. 5 as a first magnetic field 540a and a second magnetic field 540b). In FIG. 5, the force assembly 504 includes a first portion 504a and a second portion 504b. The first portion 504a is carried by the second portion 5b of the housing 1, extends around the interior of the housing 1, and produces the first magnetic field 540a. The second portion 504b of the force assembly 504 is carried in by the support element 3, extends with the support element 3 around the interior of the housing 1, and produces the second magnetic field 540b. In the illustrated embodiment, the first and second magnetic fields 540a and 540b are opposing magnetic fields. Accordingly, the first and second portions 504a and 504b repel one another providing a force that urges the input element 2 to return to neutral when the input element 2 is displaced from the neutral position. In selected embodiments, the housing can be configured to provide shielding between the magnetic fields 540 produced by the force assembly 504, the sensor, and/or the magnetic element. In other embodiment, the force assembly can use one or more magnetic fields in other ways (e.g., including retractive forces) to provide various forces and/or force gradients.

In still other embodiments, the force assembly and/or the hall effect system can have other arrangements. For example, in selected embodiments the hall effect system does not include a support element 3 and the input element 2 interacts directly with the force assembly 4. In other embodiments, the force assembly can be configured to interact with other portions of the input element 2 (e.g., the extension portion 21). In still other embodiments, the force assembly 4 can also be configured to act as a hard stop. For example, in selected embodiments the force assembly 4 can include a spring device that provides a hard stop when the spring device is fully depressed.

In selected embodiments, various components of the hall effect system can be configured to be snapped together. For example, in certain embodiments the magnetic element 8 can be secured to the inside of the flared portion of the input element 2 via a cylindrical cutout retention feature. Additionally, the sensor can be keyed onto part of the second portion 5b of the housing 1 and be retained in place by a combination of force fit, snap fit, and/or adhesive bond. Furthermore, as discussed above, in selected embodiments various coatings can be used to increase conductivity, provide insulation, provide lubricous surface(s), and/or the like. For example, in selected embodiments Magnaplate HMF®, Magnaplate HTR®, and NEDOX® coatings (available from the General Magnaplate Corporation of Linden, N.J.) can be used on various hall effect system components to obtain selected conductivity and/or lubricous characteristics. For example, in selected embodiments the portions of the input element can be coated with Magnaplate HMF® and portions of the housing can be coated with Magnaplate HTR® and/or NEDOX®.

Figure 6A:
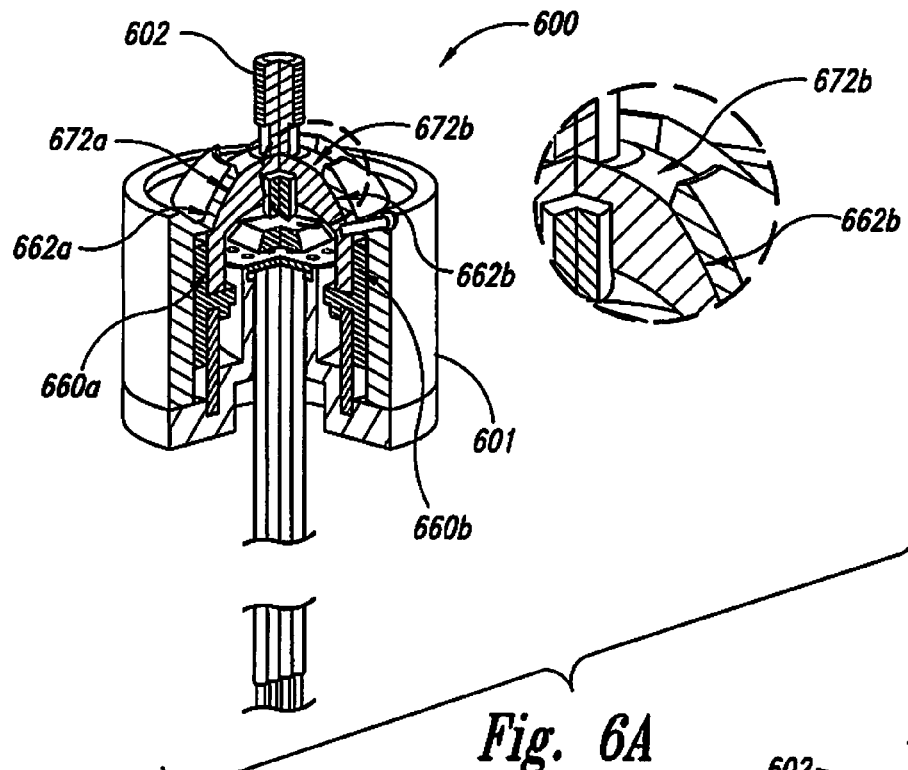
FIGS. 6A and 6B are isometric illustrations of a hall effect system in accordance with selected embodiments of the invention.

FIG. 6A is an isometric cut away illustration of another embodiment of a hall effect system 600. In general, the hall effect system 600 may be similar to the hall effect system 100, in which like elements refer to like elements throughout. In FIG. 6A, the hall effect system 600 includes a housing 601 and an input element 602 in an arrangement that mitigates or reduces hysteresis. The housing includes undercut regions 660a and 660b and partially spherical contact surfaces 662a and 662b. The input element 602 includes partially spherical contact surfaces 672a and 672b, which are aligned, respectively, with the contact surfaces 662a and 662b of the housing 601. In many embodiments, the contacts surfaces 672a and 672b are positioned to reduce surface contact between the input element 602 and the housing 601. For example, the contact surfaces 672a and 672b are not in physical contact with the housing 601 at the undercut regions 660a and 660b.

Figure 6B:
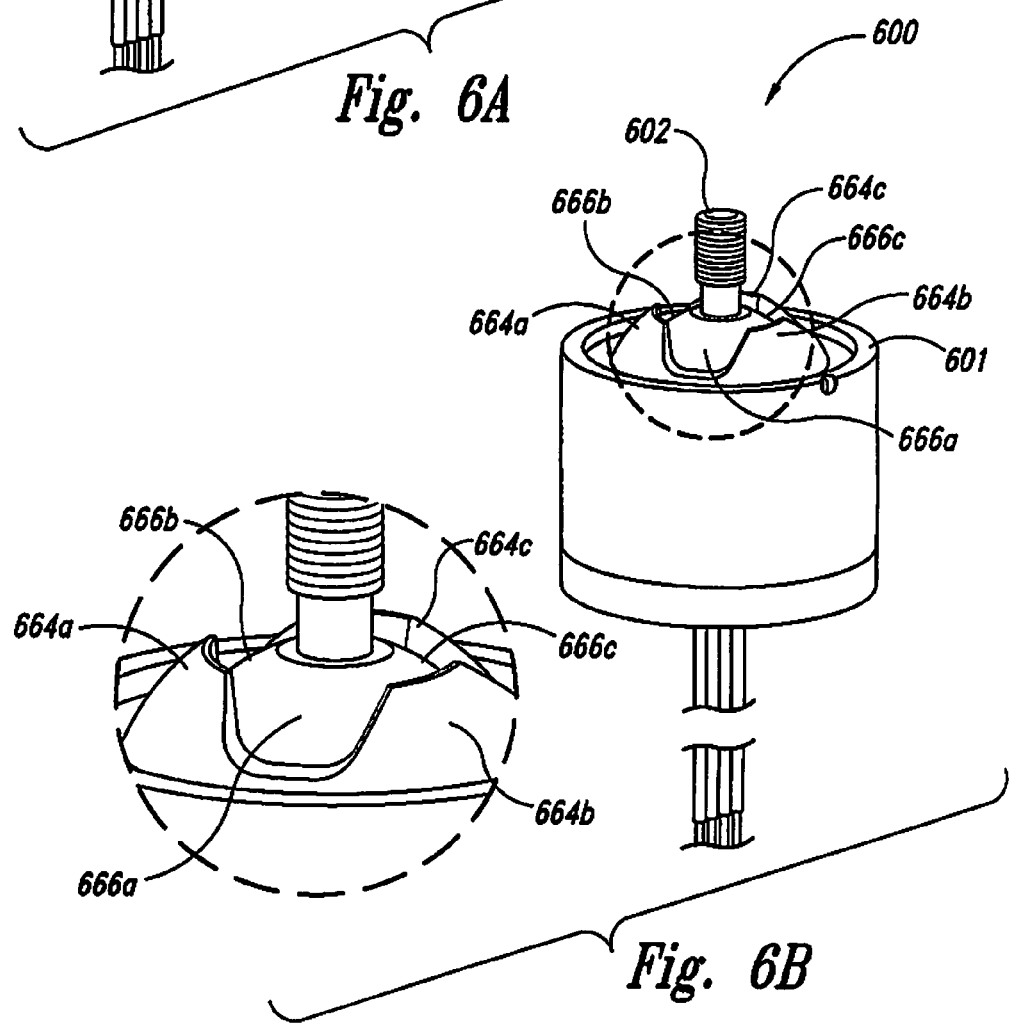

FIG. 6B is another isometric illustration of the hall effect system 600, including the housing 601 and the input element 602 arranged in a "three points of contact" design. The housing 601 includes projections 664a-c separated from one another by gaps 666a-c and physically contacting portions of the input element 602. For example, the projections 664a and 664b may align, respectively, with the portions of the contact surfaces 672a and 672b (FIG. 6A). In many embodiments, the projections 664a-c maintain a path of conductivity for grounding and the gaps 666a-c facilitate maintenance of hall effect system 600. For example, the gaps 666a-c expose surface portions of the input element 602 that can be cleaned of debris that may fall between the housing 601 and the input element 602.

FIGS. 7A-D are various isometric and schematic illustrations of a cursor control device 780 that includes the hall effect system 600. In general, the cursor control device 780 may exhibit similar functionality of a standard cursor control device, such as those used for personal computing applications. In addition, the cursor control device 780 maintains many of the features of the hall effect system 600, including return to center, low hysteresis, variable actuation force, and reduced user fatigue. The cursor control device 780 also is less susceptible to unwanted input from vibration and shock.

Figure 7B:
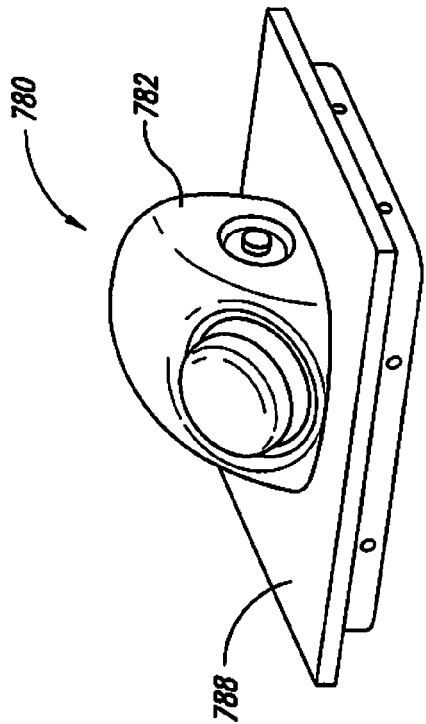
FIGS. 7A-D are isometric and schematic illustrations of a hall effect system carried by a cursor control device in accordance with selected embodiments of the invention.
Figure 7D:
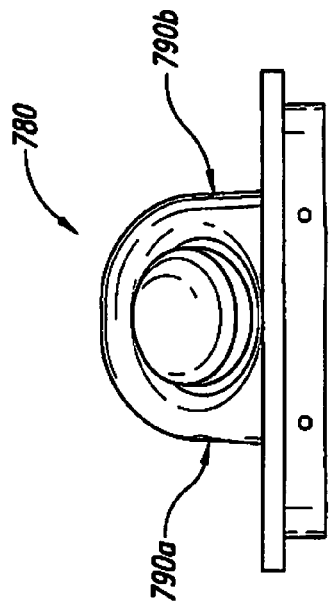
Figure 7A:
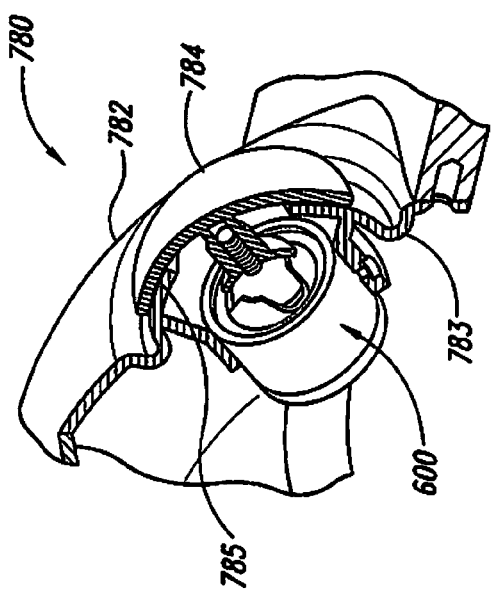

FIG. 7A is an isometric cutaway illustration of the cursor control device 780 showing a housing body 782 that carries the hall effect system 600 and a knob 784 coupled to the input element 602 of the system 600. The housing body 782 may include a channel 783 for collecting and/or deflecting unwanted debris away from the hall effect system 600 and the knob 784. In additional or alternative embodiments, the knob 784 may substantially overlap a portion 785 of the housing body 782, which can also reduce or eliminate the accumulation of unwanted debris.

FIG. 7B is an isometric illustration of the cursor control device 780 showing an ergonomic shape of the housing body 782 and the housing body attached to a panel 788. The ergonomic shape of the housing body 782 may conform to a shape of an individual's hand, for example, mitigating any stress and/or fatigue associated with operating the cursor control device 780. Similarly, the panel 788 can be positioned to support an individual's wrist. Alternatively, the panel 788 can be omitted and the cursor control device 780 can be incorporated into a mounted grip, control wheel, or a hand held device (not shown).

Figure 7C:
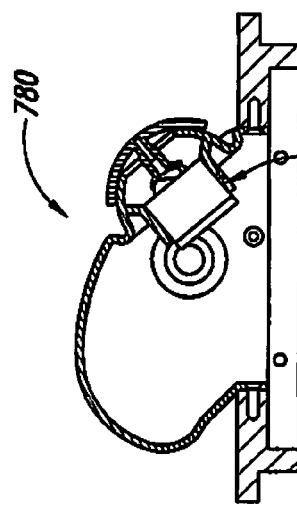

FIG. 7C is a cross-sectional elevation of the cursor control device 780 showing the positioning of the hall effect system 600 within the housing body 782. In general, the housing body 782 can be opened or partially removed so that hall effect system and other components can be easily accessed and/or repaired.

FIG. 7D is a cross-sectional elevation of the cursor control device 780 showing additional input buttons/switches 790a and 790b positioned at exterior surfaces of the housing body 782. In several embodiments, the buttons/switches 790a and 790b may be in electrical communication with the sensor 12 and/or processing element 30 (FIG. 1). For example, the buttons/switches 790a and 790b may be used in a calibration process of the hall effect system 600.

FIG. 8 is a partially schematic illustration of a vehicle 880 (e.g., an aerospace vehicle) that carries a control device 882 that includes a hall effect system 800 in accordance with embodiments of the invention. In FIG. 6, the control device includes a structure for carrying the hall effect system 800 and is configured to allow an operator 890 to control a target device 884 via a wireless pathway 809. In the illustrated embodiment, the target device 884 includes a robot with a camera. In other embodiments, the target device 884 can include other types of devices and/or systems, including a portion of the vehicle 880 carrying the control device 882. In other embodiments, the hall effect system can have other uses. Additionally, in still other embodiments, the hall effect system can have other arrangements including more, fewer, and/or different component. For example, in other embodiments the system can include various dimensions; various materials; various actuation forces; various ways of producing forces, various force gradient profiles; various assembly/retention methods; various knob shapes; and/or various degrees of travel/freedom.

Some of the embodiments discussed above can have the following features and/or advantages: Less current draw than selected transducers; varying force curves can be accomplished without a major redesign (e.g., with the change of one or two internal components); lower cost solution than selected strain gage transducers; increased life over selected transducers; smaller size over selected transducers; low operator fatigue; low or no mechanical sensor stress compared to selected strain gage transducers; the force assembly can allow for low hysteresis, low null output voltages, and high resolution at the output; and/or more consistent null temperature coefficient compared to selected strain gage transducers.

The above-detailed embodiments of the invention are not intended to be exhaustive or to limit the invention to the precise form disclosed above. Specific embodiments of, and examples for, the invention are described above for illustrative purposes, but those skilled in the relevant art will recognize that various equivalent modifications are possible within the scope of the invention. For example, whereas steps are presented in a given order, alternative embodiments may perform steps in a different order. The various aspects of embodiments described herein can be combined and/or eliminated to provide further embodiments. Although advantages associated with certain embodiments of the invention have been described in the context of those embodiments, other embodiments may also exhibit such advantages. Additionally, not all embodiments need necessarily exhibit such advantages to fall within the scope of the invention.

Unless the context clearly requires otherwise, throughout the description and the claims, the words "comprise," "comprising," and the like are to be construed in an inclusive sense as opposed to an exclusive or exhaustive sense, i.e., in a sense of "including, but not limited to." Additionally, the words "herein," "above," "below," and words of similar import, when used in this application, shall refer to this application as a whole and not to any particular portions of this application. Use of the word "or" in reference to a list of items is intended to cover a) any of the items in the list, b) all of the items in the list, and c) any combination of the items in the list.

We claim:

1. A hall effect system, comprising:
   a housing;
   an input element coupled to the housing;
   a magnetic element coupled to the input element and configured to have a detectable magnetic flux;
   a sensing element adjacent to the magnetic element, the sensing element being configured to sense the magnetic flux; and
   a processing element coupled to the sensing element and configured to determine a position of the magnetic element relative to the sensing element by determining changes in the magnetic flux upon movement of the input element by a user;
   wherein the housing has a partially spherical first contact surface, and the input element has a partially spherical second contact surface aligned with the partially spherical first contact surface and positioned to define a range of motion for the magnetic element.

2. The system of claim 1 wherein the magnetic element is coupled to the input element and configured to move with the input element as a unit relative to the sensing element.

3. The system of claim 1 wherein the magnetic element is carried by a portion of the input element.

4. The system of claim 1, further comprising an interface element coupled to the input element and configured to be engaged and moved by a user to move the input element and the magnetic element relative to the sensing element.

5. The system of claim 1 wherein the housing has a first portion adjacent to the input element and positioned to protect the magnetic element, and the housing has a second portion that supports the sensing element adjacent to the magnetic element.

6. The system of claim 1 wherein the housing has an aperture and at least a portion of the input element extends through the aperture, and further comprising a cover element coupled to the input element and positioned relative to the housing to cover at least a portion of the aperture.

7. The system of claim 6 wherein the cover is connected to the input element and is positioned to engage the housing to restrict the input element and the magnetic element from moving in a direction axially aligned with the input element.

8. The system of claim 1 further comprising a stop element coupled to the input element and the housing to restrict the input element and the magnetic element from moving in a direction axially aligned with the input element.

9. The system of claim 1 wherein the magnetic element has a first position relative to the sensing element, and the magnetic element has a second position relative to the sensing element, and further comprising an urging element coupled to the magnetic element and configured to provide an urging force to return the magnetic element away from the second position to the first position.

10. The system of claim 1 wherein the input element has a first position relative to the sensing element, and the input element has a second position relative to the sensing element, and further comprising an urging element coupled to the input element and configured to provide an urging force to return the input element away from the second position to the first position.

11. A hall effect system, comprising:
a housing;
an input element coupled to the housing;
a magnetic element coupled to the input element and configured to have a detectable magnetic flux;
a sensing element adjacent to the magnetic element, the sensing element being configured to sense the magnetic flux; and
a processing element coupled to the sensing element and configured to determine a position of the magnetic element relative to the sensing element by determining changes in the magnetic flux upon movement of the input element by a user;
wherein one of the housing and the input element has at least three projections spaced apart from each other and positioned adjacent to a contact surface of the other of the housing and the input elements to form at least three points of contact between the input element and the housing.

12. The system of claim 11 wherein the projections define a path of conductivity for grounding.

13. The system of claim 11 wherein the magnetic element has a first position relative to the sensing element, and the magnetic element has a second position relative to the sensing element, and further comprising an urging element coupled to the magnetic element and configured to provide an urging force to return the magnetic element away from the second position to the first position.

14. A hall effect system, comprising:
a housing with a first contact surface portion;
an input element coupled to the housing and having a second contact surface portion immediately adjacent to the first contact surface portion, the input element being moveable relative to the housing whereby the second contact surface is moveable relative to the first contact surface to define a range of motion of the input element relative to the housing;
a magnetic element coupled to the input element and being moveable with the input element relative to the housing, the magnetic element being configured to provide a detectable magnetic flux;
a sensing element adjacent to the magnetic element, the sensing element being configured to sense the magnetic flux; and
a processing element coupled to the sensing element and configured to determine a position of the magnetic element relative to the sensing element by determining changes in the magnetic flux upon movement of the input element by a user.

15. The system of claim 14 wherein the magnetic element is coupled to the input element and configured to move with the input element as a unit relative to the sensing element.

16. The system of claim 14 wherein the magnetic element is carried by a portion of the input element.

17. The system of claim 14 wherein the housing has a first portion adjacent to the input element and positioned to protect the magnetic element, and the housing has a second portion that supports the sensing element adjacent to the magnetic element.

18. The system of claim 14 wherein the magnetic element is positionable in a first position relative to the sensing element, and the magnetic element has a second position relative to the sensing element, and further comprising an urging element coupled to the magnetic element and configured to provide an urging force to return the magnetic element away from the second position to the first position.

19. The system of claim 14 wherein one of the housing and the input element has at least three projections spaced apart from each other to define the first or second contact surface and positioned adjacent to the other the first and second contact surface to form at least three points of contact between the input element and the housing.

* * * * *